(12) United States Patent
Huang et al.

(10) Patent No.: US 7,470,994 B2
(45) Date of Patent: Dec. 30, 2008

(54) BONDING PAD STRUCTURE AND METHOD FOR MAKING THE SAME

(75) Inventors: Tai-Chun Huang, Hsinchu (TW); Chih-Hsiang Yao, Taipei (TW); Chin-Chiu Hsia, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 40 days.

(21) Appl. No.: 11/477,940

(22) Filed: Jun. 30, 2006

(65) Prior Publication Data
US 2008/0003820 A1 Jan. 3, 2008

(51) Int. Cl.
H01L 23/48 (2006.01)
H01L 23/52 (2006.01)
H01L 29/40 (2006.01)

(52) U.S. Cl. .............. 257/774; 257/686; 257/E21.17; 257/E21.006; 257/E21.499; 257/E21.503

(58) Field of Classification Search .............. 257/686, 257/701, 760, 762, 763, 765, 774, 775, 777, 257/778
See application file for complete search history.

(56) References Cited

U.S. PATENT DOCUMENTS

| 6,815,619 | B2 * | 11/2004 | Iwasaki et al. | 174/255 |
| 7,253,363 | B2 * | 8/2007 | Iwasaki et al. | 174/255 |
| 2006/0264035 | A1 * | 11/2006 | Nogami | 438/638 |
| 2007/0158788 | A1 * | 7/2007 | Yang | 257/620 |

FOREIGN PATENT DOCUMENTS

CN 1399334 A 2/2003

* cited by examiner

*Primary Examiner*—David Nhu
(74) *Attorney, Agent, or Firm*—Birch, Stewart, Kolasch & Birch, LLP

(57) ABSTRACT

A semiconductor device includes a substrate with a dielectric layer thereon, a stack of interconnection structures in the dielectric layer, each interconnection structure including a conductive layer and a layer of plugs connecting the conductive layer, at least a layer of plugs including a crack stopper, and a bonding pad structure with a predetermined bump area thereon, overlying the stack of interconnection structures, wherein the crack stopper is formed along an edge of a projection area corresponding to the predetermined bump area.

11 Claims, 6 Drawing Sheets

BONDING PAD STRUCTURE AND METHOD FOR MAKING THE SAME

BACKGROUND OF THE INVENTION

1. Field of the Invention

The present invention relates to a semiconductor device, and more particularly relates to a semiconductor device with a bonding pad structure.

2. Description of the Related Art

As electrical components are made smaller, various strategies have been adopted to reduce the amount of space devoted to connections between the chips containing the integrated circuit devices and the printed circuit board on which the chips are mounted. Electrical connections between integrated circuits on a chip and the printed circuit board are made through bonding pads typically provided at the periphery of the chip.

Bonding pads are the interfaces between the integrated circuits contained in semiconductor chips and the chip package. A large number of bonding pads are required to transmit power, ground and input/output signals to the chip devices. It is thus important that the bonding pad yield be sufficiently high to ensure a high per chip yield.

Conventional bonding pad structures have been observed to delaminate or have layers that separate from one another in response to external forces like those applied in wire bonding processes of the type typically used attaching wires to the bonding pads.

The general bonding pad structure consists of metal layers, emanating from the terminals of the chip devices, separated by intermetal dielectric (IMD) layers that are often silicon oxide. Metal vias, tungsten (W) often being used, pass through the IMD layers connecting the metal layers. Wires are bonded to a bonding metal pattern and to the chip package forming electrical connections between the chip and the package. A passivation layer covers the surface, except over the bonding sites, to seal the chip from contaminants and for scratch protection.

One mode of failure of the bonding pad relates to the peeling of the wire from the metal pattern due to forces exerted especially during the bonding process. A bonding pad structure with increased peeling resistance and a cleaning method to ensure contamination free bonding have been disclosed in the prior art. Besides, another failure mode that has been observed relates to bonding pad peel back, where forces during wire bonding may cause a delaminating of one or more of the underlying layers. Bonding pad structures that resist bonding pad peeling have been also recited in the related filed.

It has been observed that wire bonding may cause the bonding pad to lift off or peel back (delaminate) from one or more of the underlying layers, weakening the bonding pad structure and damaging other portions of the chip's wiring. Such peel back reduces or prevents electrical contact between the bonding pad and the integrated circuit devices on the chip, which decreases the reliability and reduces the life of the chip.

Once a small crack is initiated it will, under stresses prevalent in the layer during processing, grow extensively. Approaches to alleviate this cracking of the IMD focus on producing IMD layers with low residual stress. Composite silicon oxide layers serve this purpose and are used, such as HDP plus PETEOS layers. However, even with composite silicon oxide layers to reduce stress, the IMD layer is not strong enough to withstand stresses encountered during chip packaging and IMD cracking is still observed.

It is desirable to form bonding pad structures exhibiting improved durability with better adhesion to underlying layers, so that the bonding pad structures are more compatible with chip-on-board techniques.

BRIEF SUMMARY OF THE INVENTION

The invention provides a semiconductor device with a bonding pad structure capable of avoiding cracking occurred during the manufacturing process and a method for making the same. A detailed description is given in the following embodiments with reference to the accompanying drawings.

An embodiment of a semiconductor device, comprising: a substrate with a dielectric layer thereon; a stack of interconnection structures in the dielectric layer, each interconnection structure comprising a conductive layer and a layer of plugs connecting the conductive layer, at least a layer of plugs comprising a crack stopper; and a bonding pad structure with a predetermined bump area thereon, overlying the stack of interconnection structures; wherein the crack stopper is formed along an edge of a projection area corresponding to the predetermined bump area.

An embodiment of method of fabricating a semiconductor device, comprising: providing a substrate with a dielectric layer thereon; forming a stack of interconnection structures in the dielectric layer, each interconnection structure comprising a conductive layer and a layer of plugs connecting the conductive layer; and forming a bonding pad structure with a predetermined bump area thereon, overlying the stack of interconnection structures; and forming a crack stopper in at least a layer of plugs along an edge of a projection area corresponding to the predetermined bump area.

Another embodiment of method of fabricating a semiconductor device, comprising: providing a substrate with a first dielectric layer thereon; forming lower interconnection structures in the first dielectric layer, each lower interconnection structure comprising a first conductive layer and a first layer of plugs connecting the first conductive layer, wherein at least a first layer of plugs comprising at least a strong plug as a crack stopper; and forming an uppermost interconnection structure in a second dielectric layer and overlying the lower interconnection structures, the uppermost interconnection structure comprising a second conductive layer and a second layer of plugs connecting the second conductive layer; forming a bonding pad structure with a predetermined bump area overlying the uppermost interconnection structure ; wherein the at least a strong plug is formed along an edge of a projection area corresponding to the predetermined bump area and has a size about more than 1 μm*1 μm.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
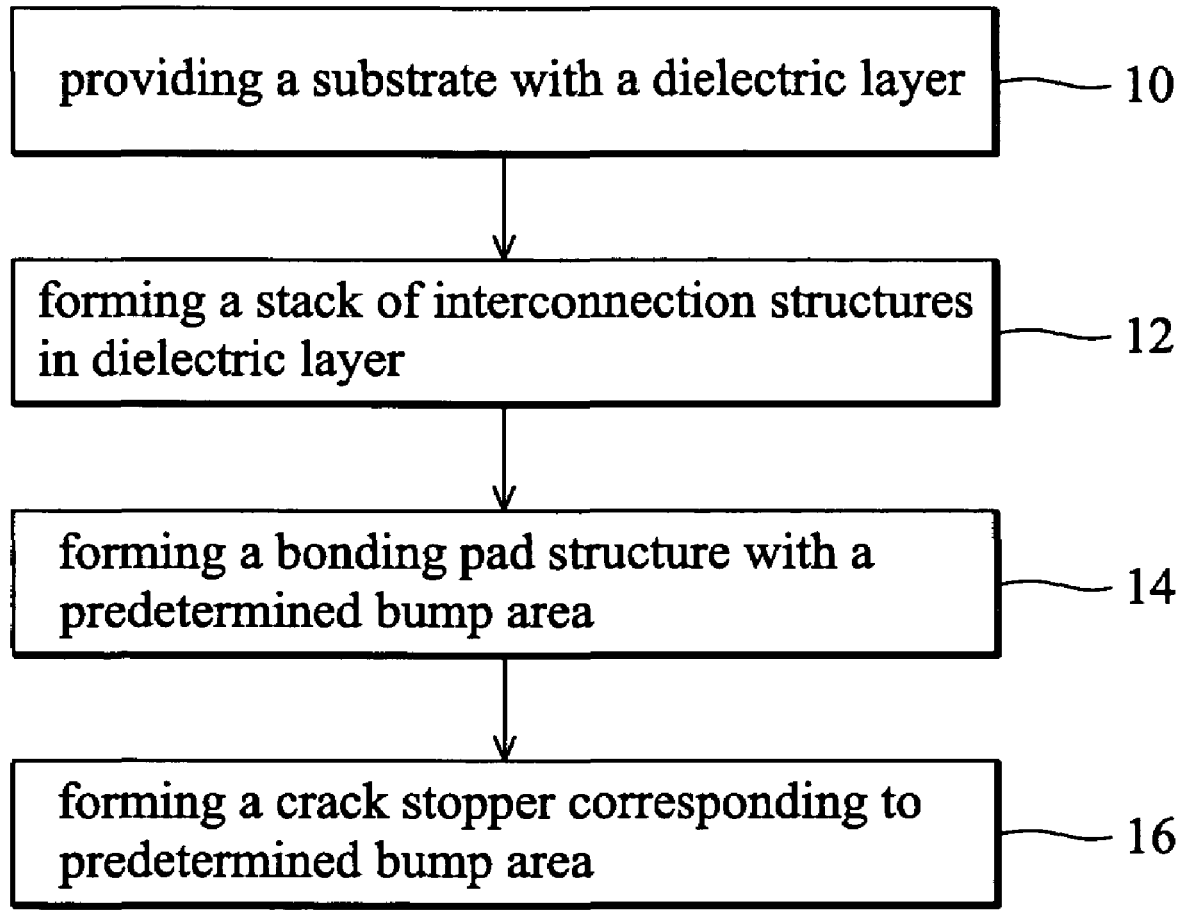
FIG. 1 shows a flow chart of preparing a bonding pad structure of the semiconductor device.

The invention, which provides a semiconductor device with a bonding pad structure and a method for making the same, will be described in greater detail by referring to the drawings that accompany the invention. It is noted that in the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions indicate not only the direct contact of layers, but also, a non-contact state of one or more laminated layers.

Figure 2:
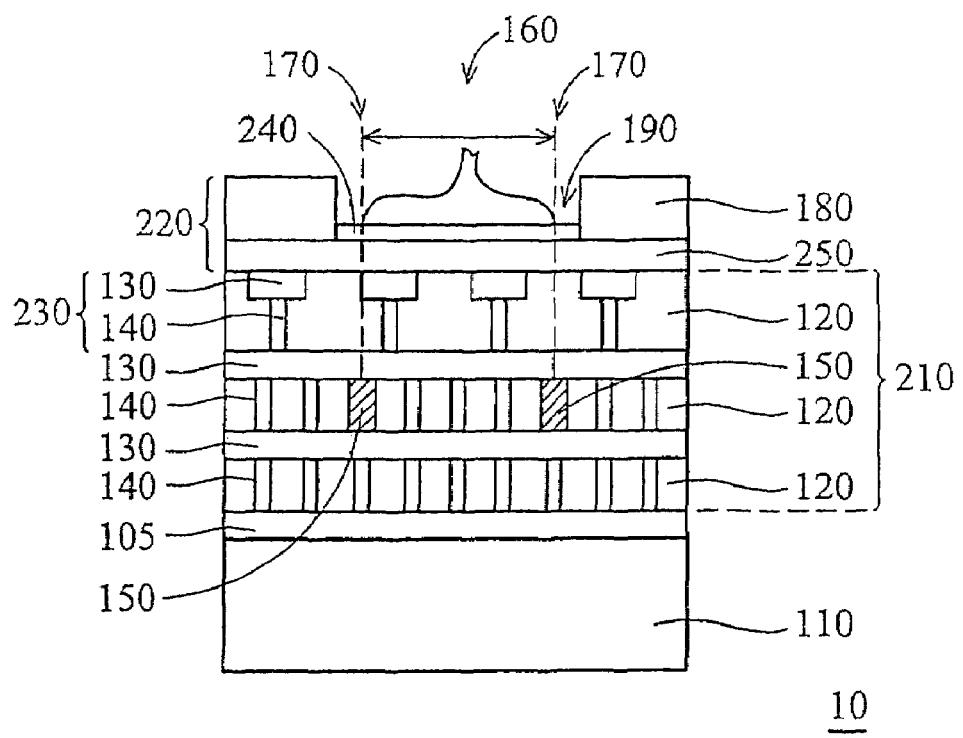
FIG. 2 shows a cross-sectional view of an embodiment of the semiconductor device with the bonding pad structure.

FIG. 2 shows a cross section view of a semiconductor device 10 with a bonding pad structure 220 of an embodiment. Referring to FIG. 2, a dielectric layer 120 is deposited on a substrate 110. Thereafter, a stack of interconnection structures 210 is formed in the dielectric layer 120 for electrical connecting circuits or metal layers 105 on the substrate, each interconnection structure 210 comprising a conductive layer 130 and a layer of plugs 140 connecting the conductive layer 130. Specifically, at least a layer of plugs 140 comprises a crack stopper 150. In general, the stack of interconnection structures 210 comprises an uppermost interconnection structure 230 and the at least a layer of plugs 140 comprising the crack stopper 150 is under the uppermost interconnection structure 230. Subsequently, a bonding pad structure 220 with a predetermined bump area 160 thereon is provided, overlying the stack of interconnection structures 210. Typically, the at least a layer of plugs 140 comprising the crack stopper 150 is embedded in a low-k dielectric layer 120. Specifically, the crack stopper 150 is formed along an edge 170 of a projection area corresponding to the predetermined bump area 160.

The specific characteristic of the embodiment is the stack of interconnection structures 210 comprise at least a layer of plugs 140 with the crack stopper 150 formed along an edge 170 of a projection area corresponding to the predetermined bump area 160. Typically, the crack stopper 150 comprises at least a strong plug having a size more than about 1 μm*1 μm. In some embodiments, the crack stopper comprises at least a strong plug having a size no more than about 10 μm* 10 μm.

Figure 3:
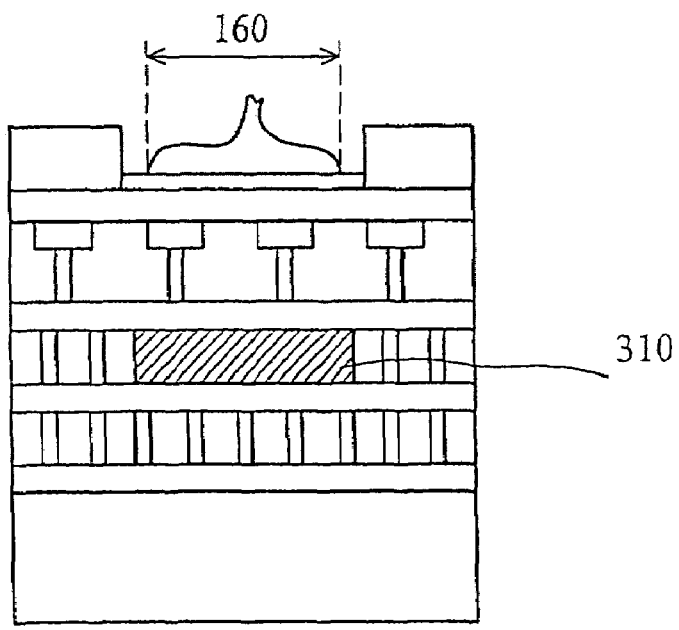
FIG. 3 shows a cross-sectional view of an embodiment of the semiconductor device with the bonding pad structure.
Figure 4:
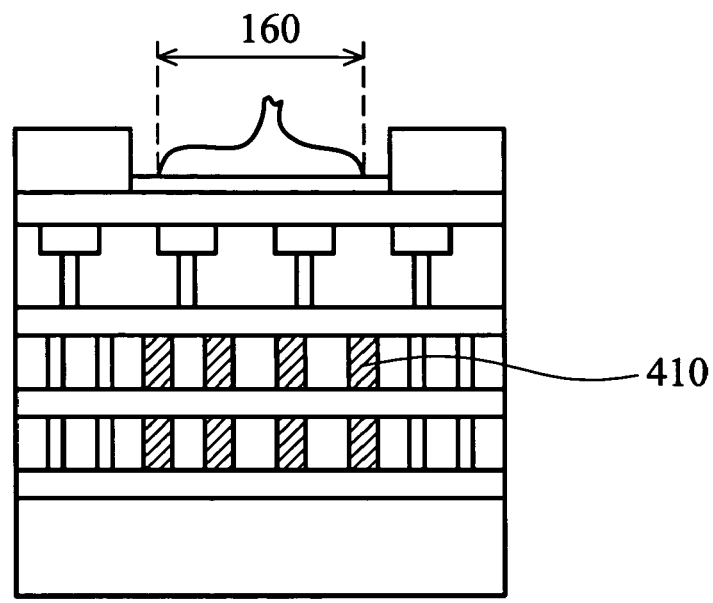
FIG. 4 shows a cross-sectional view of an embodiment of the semiconductor device with the bonding pad structure.
Figure 5:
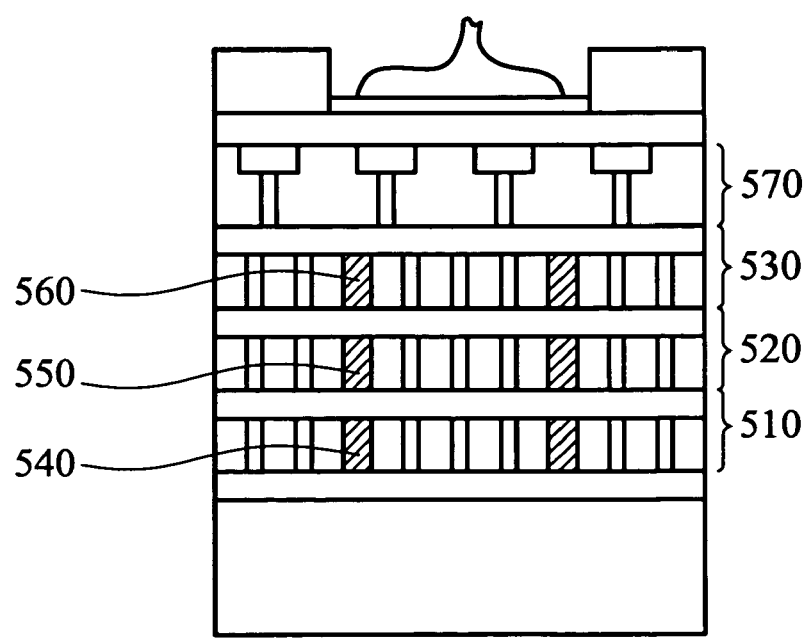
FIG. 5 shows a cross-sectional view of an embodiment of the semiconductor device with the bonding pad structure.

Referring to FIGS. 3-5, exemplary embodiments of a semiconductor device with bond pad structure is further illustrated, while explanation of the same or similar portions to the description in FIG. 2 will be omitted.

As shown in FIG. 3, in one embodiment, the crack stopper may comprise a single strong plug 310, in which an entire projection area corresponding to the predetermined bump area 160 is occupied by the single strong plug 310.

As shown in FIG. 4, in some embodiments, the crack stopper may optionally comprise a plurality of strong plugs 410 formed within the projection area corresponding to the predetermined bump area 160, wherein the strong plugs 410 are of sizes more than about 1 μm*1 μm.

As shown in FIG. 5, in some embodiments, more than one layer of plugs 140 under the uppermost interconnection structure 230 may comprise the crack stopper respectively; for example, three successive layers 510, 520, 530 of plugs under the uppermost interconnection structure 570 comprise the crack stopper 540, 550, 560 respectively. In addition, the strong plug recited above may be square or rectangular shaped.

Returning now to FIG. 2, in general, the bonding pad structure 220 may comprise a passivation layer 180 with a window 190, overlying the stack of interconnection 210 and a bonding pad layer 240 with a bump area 160 thereon in the window 190. Besides, the bonding pad structure 220 may further comprise a contact pad 250, as a stress buffer layer, between the stack of interconnection 210 and the bonding pad layer 240. Furthermore, the circuit may be existed under the stack of interconnection 210 and the bonding pad structure 220 in some embodiments of the invention.

An embodiment also discloses a method of manufacturing a semiconductor with a bonding pad structure. As shown in FIG. 1, the method of fabricating a bonding pad structure 10 of the embodiment is provided. At step 10, a dielectric layer 120 is formed on a substrate 110. Thereafter, referring to step 12, a stack of interconnection structures 210 is formed in the dielectric layer 120, wherein each interconnection structure 210 comprises a conductive layer 130 and a layer of plugs 140 connecting the conductive layer 130. Subsequently, at step 14, a bonding pad structure 220 with a predetermined bump area 160 thereon is formed overlying the stack of interconnection structures 210. At step 16, a crack stopper 150 is formed in at least a layer of plugs 140 along an edge 170 of a projection area corresponding to the predetermined bump area 160.

As described above, the crack stopper 150 typically comprises at least a strong plug having a size more than about 1 μm*1 μm. In general, in the method of manufacturing a semiconductor with a bonding pad structure, the crack stopper comprises a plurality of strong plugs formed within the projection area corresponding to the predetermined bump area. In one embodiment, the crack stopper comprises a single strong plug in which an entire projection area corresponding to the predetermined bump area is occupied by the single strong plug, specifically, the at least a strong plug has a size no more than about 10 μm* 10 μm. Typically, the at least a strong plug may be square or rectangular shaped.

In general, the bonding pad layer 240 is formed from a material such as Cu/TiN or AlCu/TiN. The conductive layers 130 are formed from a material such as Cu/TiN. The layer of plugs 140 are formed of a material such as copper or tungsten. In addition, the dielectric layer 120 may be formed of a material such as silicon dioxide formed using plasma enhanced deposition of tetra-ethyl orthosilicate or low-K dielectric film. In one example, the dielectric layer 120 may be a stack dielectric made by a CVD process and the interconnection structures may be formed by a dual damascene process.

Figure 6:
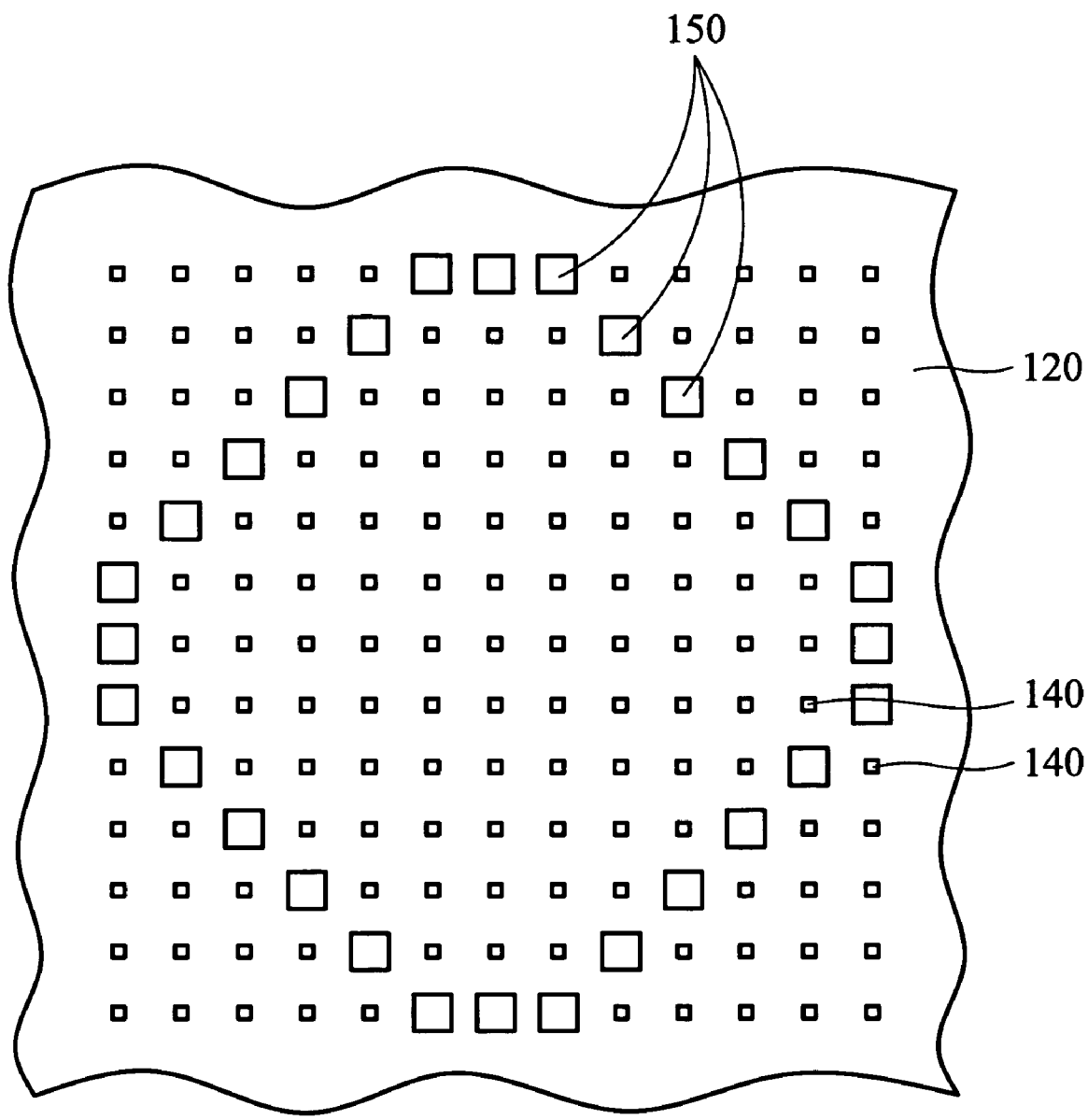
FIG. 6 shows a plan view of an embodiment of the layer of plugs with crack stopper formed in the dielectric layer.
Figure 7:
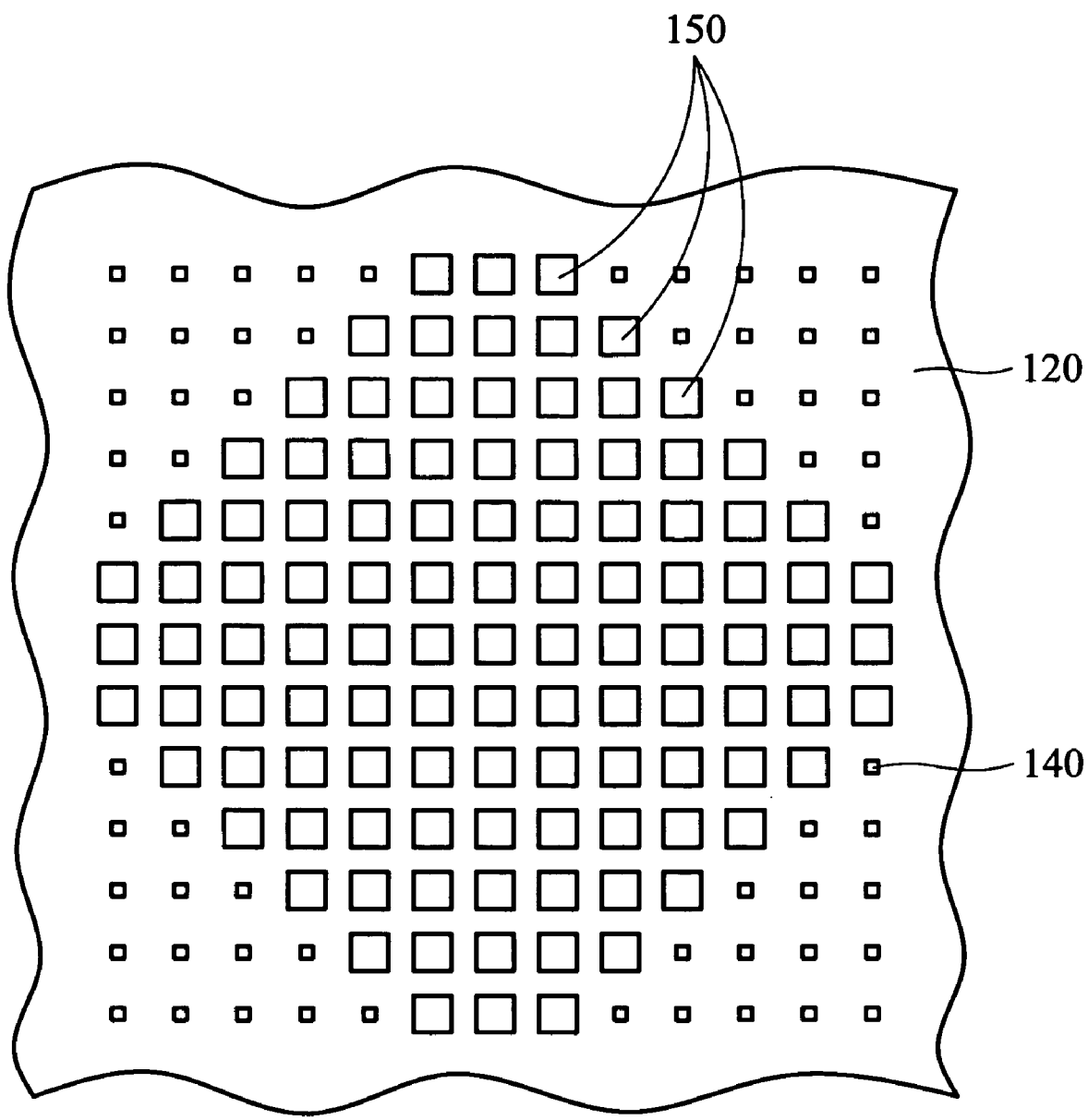
FIG. 7 shows a plan view of an embodiment of the layer of plugs with crack stopper formed in the dielectric layer.
Figure 8:
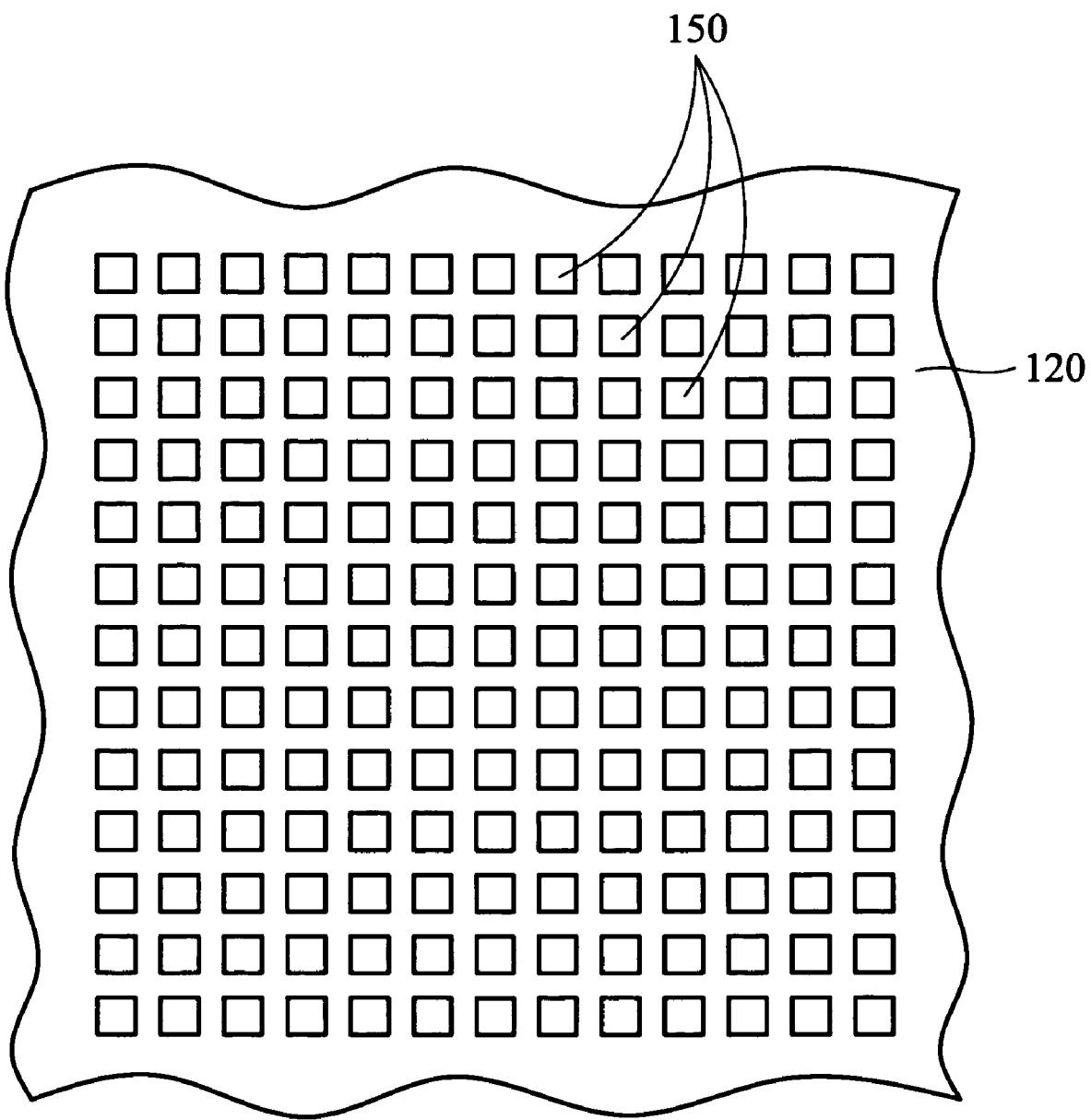
FIG. 8 shows a plan view of an embodiment of the layer of plugs with crack stopper formed in the dielectric layer.

FIG. 6-8 show the layer of plugs with crack stopper formed in the dielectric layer 120 the crack stopper 150 comprising a plurality of strong plugs formed within the projection area corresponding to the predetermined bump area 160 are square with a width of between about 1 and 10 microns while other plugs 140 not corresponding to the predetermined bump area 160 are square having a width of about 0.19 microns. In some embodiments, the strong plugs formed within the projection area corresponding to the predetermined bump area 160 with widths of about 1 to 10 microns are arranged in a ring (shown in FIG. 6), a diamond shape (shown in FIG. 7), or a blanket plane (shown in FIG. 8).

This arrangement of the plugs having widths between about 1 and 10 microns provides improved strength and reliability for the bonding pad structure. Therefore, almost none of these failures due to bonding pad peeling are occurred in the structure.

As stated above, low-k materials (where k designates the value of the dielectric constant) are used in copper IC chips in order to help reduce signal propagation delays in the chip. Accordingly, dielectric material which supports copper bonding pad and structures has a low dielectric constant. Thus, in the bonding pad structure with vias having widths of 0.19 μm, cracks would develop in the low-k material. Some of the cracks (not shown in any of the Figures) may develop immediately and some may develop later on. In any event the cracks cause an immediate damage to the circuits in the IC chip or cause a long term reliability problem. Moreover, low-k dielectric material also exhibits poor thermal conductivity. The poor thermal conductivity results in an increase in the temperature of the semiconductor chip. It is well known in the art that an increase of cracking issue of the semiconductor chip causes various problems that were discussed above.

The above disadvantages in the bonding pad structures are overcome by the interconnection structure shown above. Referring to the description above, the crack stopper corresponding to projection of the bump area with a width about more than 1 μm is shown as supporting the entire bonding pad structure and the semiconductor device. The substrate of the semiconductor device can be silicon or other semiconductor. Thus, the crack issue is further solved, and the manufacture process gains great improvements.

The structure in FIGS. 2 to 5 is for the purpose of illustration only and it shows four levels of metal and their respective plugs stacked on top of each other. The contents above are used as a guide for the purpose of illustrating the various layers of metal and plugs present in the IC chip containing bonding pad and the semiconductor device. However, it is manifest that the above embodiment can be practiced in a fabrication process using greater than four metal layers or fewer than four metal layers.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a substrate with a dielectric layer thereon;
    a stack of interconnection structures in the dielectric layer, each interconnection structure comprising a conductive layer and a layer of plugs connecting the conductive layer, at least a layer of plugs comprising a crack stopper; and
    a bonding pad structure with a predetermined bump area thereon, overlying the stack of interconnection structures,
    wherein the crack stopper is formed along an edge of a projection area corresponding to the predetermined bump area.

2. The semiconductor device as claimed in claim 1, wherein the stack of interconnection structures comprises an uppermost interconnection structure and the at least a layer of plugs comprising the crack stopper is under the uppermost interconnection structure.

3. The semiconductor device as claimed in claim 2, wherein three successive layers of plugs under the uppermost interconnection structure comprise the crack stopper respectively.

4. The semiconductor device as claimed in claim 1, wherein the crack stopper comprises at least a strong plug having a size more than about 1 μm*1 μm.

5. The semiconductor device as claimed in claim 4, wherein the crack stopper comprises a plurality of strong plugs formed within the projection area corresponding to the predetermined bump area.

6. The semiconductor device as claimed in claim 4, wherein the crack stopper comprises a single strong plug in which an entire projection area corresponding to the predetermined bump area is occupied by the single strong plug.

7. The semiconductor device as claimed in claim 4, wherein the at least a strong plug has a size no more than about 10 μm* 10 μm.

8. The semiconductor device as claimed in claim 1, wherein the at least a strong plug is square or rectangular shaped.

9. The semiconductor device as claimed in claim 1, wherein the at least a layer of plugs comprising the crack stopper is embedded in a low-k dielectric layer.

10. The semiconductor device as claimed in claim 1, wherein the bonding pad structure comprises:
    a passivation layer with a window, overlying the stack of interconnection; and
    a bonding pad layer with a bump area thereon in the window.

11. The semiconductor device as claimed in claim 9, wherein the bonding pad structure further comprises a contact pad between the stack of interconnection and the bonding pad layer.

* * * * *